United States Patent [19]

Kallweit et al.

[11] Patent Number: 5,063,950
[45] Date of Patent: Nov. 12, 1991

[54] APPARATUS AND METHOD FOR TREATING AND/OR CLEANING OF OBJECTS, PARTICULARLY CIRCUIT BOARDS

[75] Inventors: Manfred Kallweit; Horst Bläsing, both of Berlin, Fed. Rep. of Germany

[73] Assignee: Schering Aktiengesellschaft, Berlin, Fed. Rep. of Germany

[21] Appl. No.: 528,573

[22] Filed: May 23, 1990

[51] Int. Cl.$^5$ ............................................. B08B 3/02
[52] U.S. Cl. .............................. 134/64 R; 134/122 R; 134/902; 134/198; 239/553.3
[58] Field of Search .................. 134/902, 122 R, 64 R, 134/73, 131, 198, 151; 239/553.3, 552, 553.5, 558, 568; 15/77

[56] References Cited

U.S. PATENT DOCUMENTS

| | | | |
|---|---|---|---|
| 4,475,259 | 10/1984 | Ishii et al. | 134/122 R |
| 4,557,785 | 12/1985 | Ohkuma | 134/198 X |
| 4,589,926 | 5/1986 | Holmstrand | 134/72 X |
| 4,709,716 | 12/1987 | Raush et al. | 134/122 R |
| 4,724,856 | 2/1988 | Pender | 134/122 R |
| 4,846,202 | 7/1989 | Kallweit | 134/122 R |
| 4,922,938 | 5/1990 | Siegmund et al. | 134/131 X |
| 4,938,257 | 7/1990 | Morris | 134/64 R |

Primary Examiner—Frankie L. Stinson
Attorney, Agent, or Firm—Michael J. Striker

[57] ABSTRACT

The apparatus for treating and/or cleaning an object, especially a circuit board, with a flood flow of fluid comprises means for moving the object along a path in the apparatus and a number of flood flow devices past which the object is moved on the path, all of which are located above the path. A fluid damming means, preferably a pressing roll contacting the path, may be provided on each of the long sides (the sides transverse to the feed direction) of each flood flow device so that in operation a fluid pool arises around each flood flow device. The flood flow device advantageously comprises a plurality of fluid feed pipes, a fluid receiving chamber of a larger diameter than the feed pipes receiving fluid from them, a perforated mask located downstream in the fluid receiving chamber provided with a plurality of through-going holes and a distributor chamber provided with an outlet mouth located downstream of the perforated mask, the distributor chamber with the outlet mouth and the path defining a flooded space above the path. The fluid receiving chamber, the distributor chamber, the outlet mouth and the flooded space extend substantially over the entire length L of the flood flow device.

5 Claims, 3 Drawing Sheets

FIG. I

APPARATUS AND METHOD FOR TREATING AND/OR CLEANING OF OBJECTS, PARTICULARLY CIRCUIT BOARDS

BACKGROUND OF THE INVENTION

Our invention relates to an apparatus and method for treating and/or cleaning objects, especially circuit boards provided with holes. Attention is called to the copending application entitled "PROCESS FOR TREATING AND/OR CLEANING OF OBJECTS, PARTICULARLY CIRCUIT BOARDS PROVIDED WITH HOLES AND APPARATUS FOR PERFORMING SAME" filed simultaneously with this application.

One type of treatment or cleaning by a splash flow or flood of a suitable treatment and/or cleaning fluid is described in German Patent 30 11 061 and further in German Published Patent Application 35 28 575. In German Patent 30 11 061 the feed of a flood flow of fluid to the object to be treated and/or cleaned is provided from below the object. In German Published Patent Application 35 28 575 a treatment either only with splash flow nozzles or orifices from below is provided, or in the case of cleaning processes with ultrasound and electrochemical processes two flood flow orifices or nozzles which are adjustable so as to be positionable on either the top or bottom side of the circuit board are provided. The methods described in both the cited disclosures have been proven in principle, however they do not met all the requirements in practice.

SUMMARY OF THE INVENTION

It is an object of the present invention to provide an apparatus and method of the above-described kind for treating and/or cleaning of objects, particularly circuit boards, provided with holes, which operates according to the flood flow principle, but with a minimum of apparatus expense and assembly costs.

According to our present invention the apparatus comprises means for moving an object along a path and at least one flood flow device of length L having opposing longitudinal sides past which the object to be treated and/or cleaned is moved on the path in a workpiece feed direction. All of the flood flow devices are located above the path of the object to minimize apparatus expense and assembly cost. The method of the invention requires all the flood flow devices to be located above the path along which the object is moved.

With this apparatus all the applications can be handled, in which because of special circumstances, e.g. special shape of the object or only holes on top, or also very small diameter through-going passages or holes, a flood flow treatment from above is sufficient to treat and/or clean the object; under certain circumstances even more advantageously than a flood flow treatment both from above and from below, and/or only from below. This is even more true, when the treatment and/or cleaning fluid used to make the flood flow is not water, but also a fluid with a viscosity higher than water. The apparatus structured according to the teachings of our invention has the advantages of reduced construction expense and assembly cost, when the flood flow devices and/or a plurality of flood flow devices located in succession in the transport direction is and/or are located only above the path on which objects, goods or materials to be treated are moved instead of under the path. By a "flood flow", as is described in the Literature cited above, we mean a continuously flowing fluid column or a portion of fluid, which issues from the flood flow source and arrives in this form at the objects to be cleaned or treated, while in contrast the previously known spraying or jetting devices spray a sprayable or atomizable treatment fluid, which is strongly aerated as a result, on the object to be treated. In contrast the principle advantage of such a flood flow is that it exposes completely or permeates intensively the passages or holes in the object being treated with the fluid and thus allows a more complete cleaning or treatment than the spraying or jetting apparatus.

A damming up of the cleaning or treatment fluid on the path on which the object is fed may advantageously be provided by fluid damming means located on both opposing longitudinal sides of each flood flow device. These fluid damming means extend over the length L of the fluid flow device. The weight of these fluid dams assists the kinetic energy of the flood flow. Both act in concert. The combination of this sort of fluid dam with a flood flow device located above the object to be treated and/or cleaned has the advantage that a certain fluid pool is formed in the vicinity of the flood flow device on the path so that less fluid is required to attain a certain height of fluid on the object being treated. Because of that required pump capacity of the fluid is less. With the features of claim 2 the cleaning efficiency, especially for the cleaning of the holes or passages, is increased. Thus particularly in circuit boards for the Electronics industry which are provided with relatively narrow through-going passages or holes, in some cases even blind holes, which require extensive thorough cleaning, this is a considerable advantage over a treatment from below of the objects treated by a flood flow source. A certain reservoir is provided for the fluid with the fluid damming means in the vicinity of the flood flow device, which is of advantage, if the flow of fluid should be reduced for a short time or even interrupted for various reasons.

The fluid damming means is advantageously a pressing roll which is located in the vicinity of a mouth of the flood flow device or devices above the path and contacts on the object being treated as it moves along the path. This has the advantage of a simple construction and form for manufacture. The pressing rolls rotate as the material contacting them moves past them so that a damaging sliding of the damming means on the goods or material being treated due to friction between them is avoided.

The flood flow device may comprise one or a number of fluid feed pipes, a fluid receiving chamber of a larger diameter than a feed pipe connected to the fluid feed pipes or pipe so as to receive fluid from them or it, a perforated mask located downstream from the feed pipes in the receiving chamber provided with a plurality of through-going holes and a distributor chamber provided with an outlet mouth located downstream of the perforated mask. The distributor chamber with its outlet mouth and the path over which the objects being treated and/or cleaned are moved define a flooded space between them. The fluid receiving chamber, the distributor chamber, the outlet mouth and the flooded space extend over the entire length L of the flood flow device. A series of feed pipes connected with the fluid receiving chamber also are distributed over the entire length L and the perforated mask is provided with holes over the entire length L of the flood flow device.

The flood flow device according to claim 4 as described in the above paragraph has the advantage that a uniform distribution of the fluid flow and also a uniform flow cross section results over the entire width of the object to be treated and/or cleaned. This arrangement is of course already known and is described in German Published Patent Application 35 28 575, however not in connection with an apparatus as defined by the claims on which claim 4 depends.

Further advantageous features are described in the dependent claims.

BRIEF DESCRIPTION OF THE DRAWING

The objects, features and advantages of the present invention will now be illustrated in more detail by the following detailed description, reference being made to the accompanying drawing in which.

DETAILED DESCRIPTION OF THE INVENTION

Figure 1:
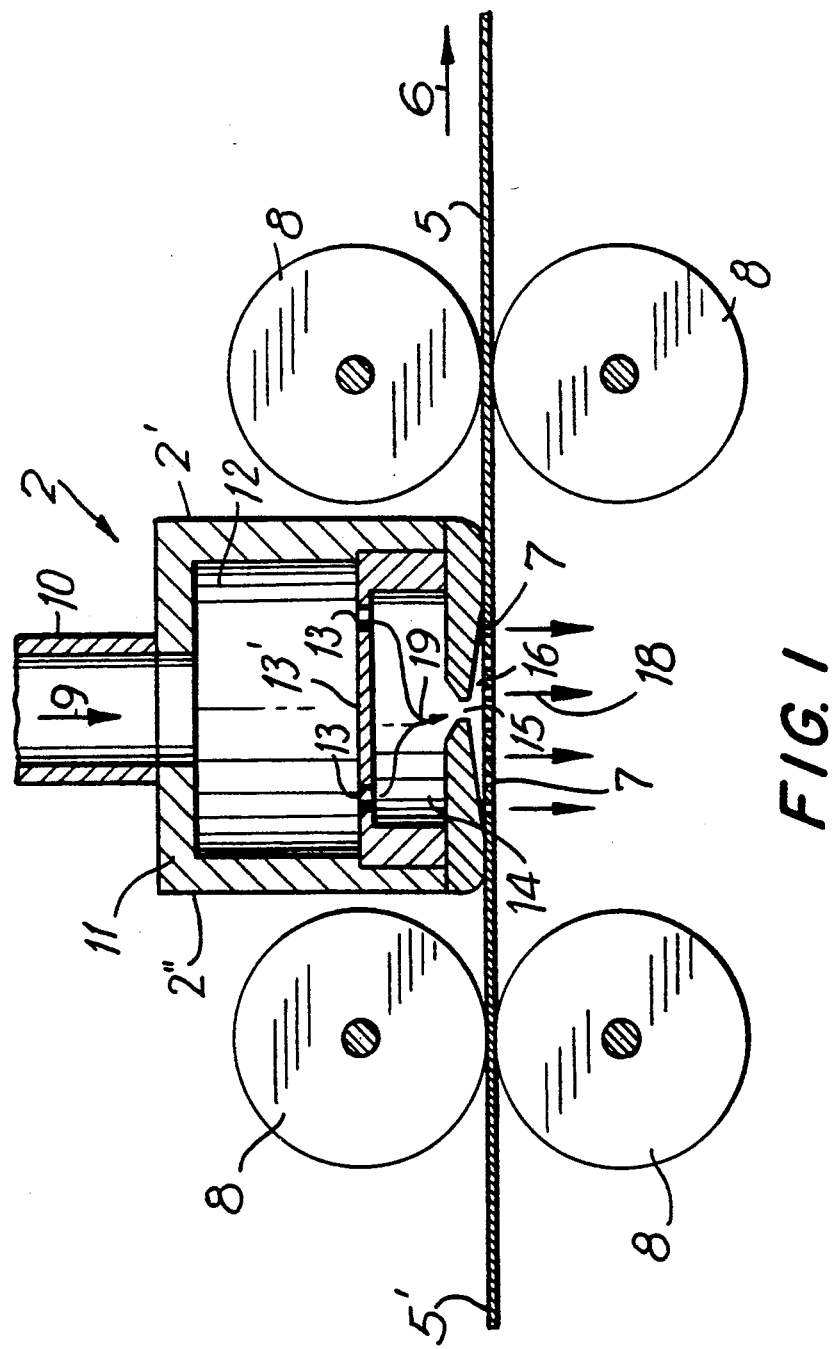
FIG. 1 is a longitudinal cross sectional view through an apparatus for treating and/or cleaning circuit boards according to our invention with a flood flow device taken along the section line I—I in FIG. 3.
Figure 2:
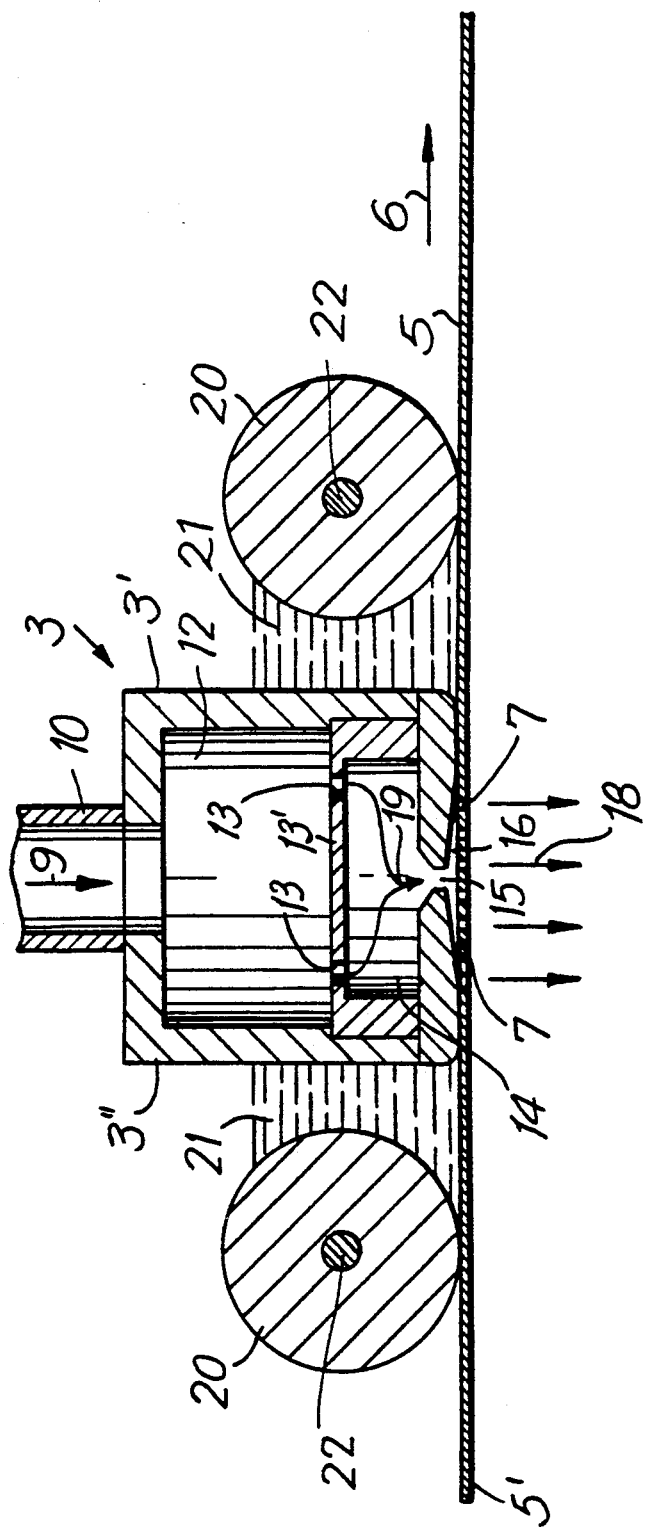
FIG. 2 is a longitudinal cross sectional view through another embodiment of an apparatus for treating and/or cleaning circuit boards according to our invention taken along the section line II—II in FIG. 3.
Figure 3:
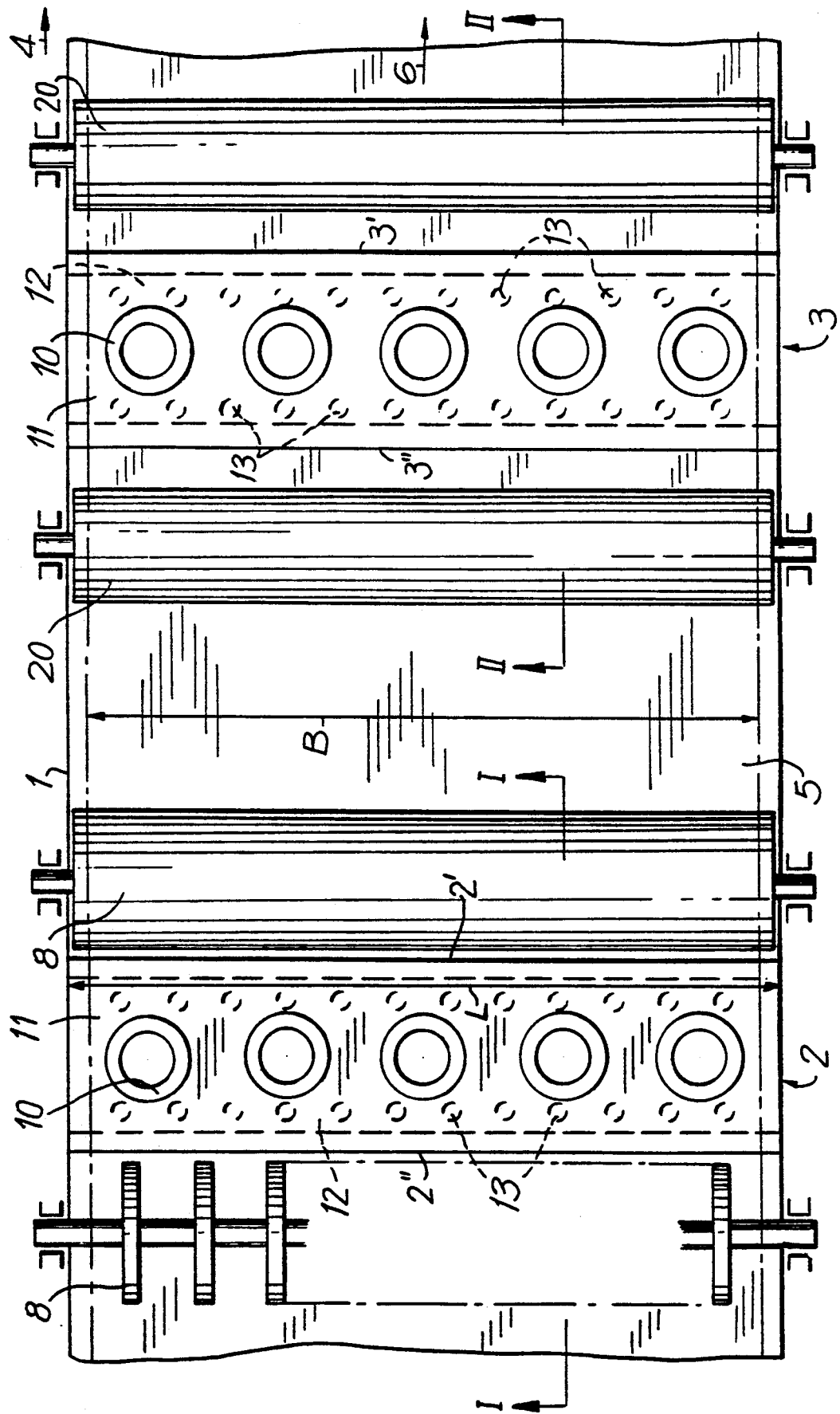
FIG. 3 is top view of an apparatus for treating and/or cleaning circuit boards according to our invention, in which the left half corresponds to a first embodiment shown in FIG. 1 and the right half corresponds to a second embodiment shown in FIG. 2.

FIG. 3 shows a schematic top plan view of an apparatus for chemical treatment and/or cleaning of plate-like or flat objects 5 comprising flood flow devices 2 and 3 having a length L and opposing longitudinal sides 2',2"; 3',3", which are positioned in succession in the direction of the arrow 4 in the desired number. The object 5 to be treated and/or cleaned, especially the circuit board for electronics, is fed in the direction of the arrow 6. To make the drawing simpler a first embodiment of the flood flow device 2 is shown in FIG. 1 and a second embodiment of the flood flow device 3 is shown in FIG. 2. It should be understood however that when the invention is practiced usually flood flow devices of the same type are located in succession in the flow direction over the object to be treated. The object 5 in the example provided here is a circuit board.

The embodiment of FIG. 1 shows the flood flow device 2 among other things. The object 5 to be treated or the object is seen edge-on or from the small side. It has through-going holes 7, which are indicated only in the vicinity of the flood flow device 2 for simplicity in the drawing. The object 5, the circuit board, is fed along a path 5' in the workpiece feed direction 6 by a plurality of disk-like feed rollers 8 mounted on a common drive shaft. The disk-like rollers 8 are the means for feeding the workpiece along the path 5'.

The treatment fluid, e.g. pure water, is fed in an unshown way according to arrow 9 through a plurality of connector or feed pipes 10 to a fluid receiving chamber 12 of larger diameter than a pipe 10 in the housing 11 of the flood flow device 2. The fluid receiving chamber 12 extends almost completely over the entire length L of the housing of the flood flow device. Thus the entire width B of the circuit board 5 or object is treated. From there the fluid flows through two or more rows of through-going holes 13 of a smaller diameter (relative to the diameter of the pipes 10) in a perforated mask 13' into a distributor chamber 14. The through-going holes 13 of the perforated mask 13' are distributed successively over the entire length L. The plurality of holes 13 of smaller diameter in a wall of the chamber 12 form the perforated mask 13'. On feeding the fluid from the receiving chamber 12 into the distributor chamber 14 there is a certain drop in fluid pressure and simultaneously a uniform distribution of fluid through the mask 13' into distributor chamber 14 over the entire length L occurs. Thus the fluid issuing from the slot-like outlet mouth 15 extending over the entire length L flows in a uniform flood with the kinetic energy residing in this flood and distributes itself in the flooded space 16, to flow away from there through the holes 17 of the object and then according to the arrows 18 downwardly. It is recommended that the holes 13 of the mask 13' be displaced relative to the pipes 10 and the outlet mouth 15 in the feed direction 6, as they are in the embodiments of FIG. 1 and 2. Thus the fluid flow 9 does not occur directly through the holes 13 into the distributor chamber 14 and further the flow cannot be directly through the holes 13, i.e. straight line flow to the flooded chamber 16 cannot occur. The treatment fluid can be sulfuric acid or a base as well as pure water or acid. In a cleaning the residues or waste products from holes 7 in the object 5 of very small diameter, e.g. 0.1 mm, are washed away without any problem. Particularly the rinsing effect of the apparatus of the invention can then occur when instead of the through-going holes 7 the object has blind holes, whose openings are directed upwardly. Also then the flood flow residues from the blind holes can be easily washed away.

The form of the flood flow device 2 with fluid receiving chamber 12 and distributor chamber 14 is particularly advantageous. The principle of the invention, namely that providing a flood flow from above the path 5' on the circuit board or object 5 to be cleaned or treated and formation of a flooded space 16 above the object and/or path can be accomplished with the arrangement with a receiving chamber and a distributor chamber, since the treatment and cleaning fluid could flow directly according to arrow 19, advantageously into a housing instead of a distributor chamber 14. Also it should be noted that with the apparatus according to our invention both a cleaning or washing fluid (particularly water) can be applied to the object, but also a treatment fluid can be applied to the object in a flood flow, when the object arrives in the vicinity of the flood flow device 2 or 3 providing the flood flow.

The previously mentioned alternatives are also present in the embodiment shown in FIG. 2, in which the same reference numbers are used for the same parts. The illustration of the feed rollers is however omitted to simplify the drawing. They could however also be present. This embodiment has the socalled fluid damming or pressing rolls 20 as fluid damming means to dam up fluid in a fluid pool region 21 shown with dashed lines in the drawing. One pressing roll 20 is located adjacent each longitudinal side 2' or 2" and 3" or 3" of each fluid flow device 2 or 3. Because of that the space, over which the treatment fluid acts on the material or object, is lengthened. This is also advantageous when the intensive action occurs first in the flooded space 16.

The fluid damming or pressing rolls 20 acting to restrain or hold back the fluid in the fluid pool region 21 extend over the entire length L of the flood flow device 2 or 3. They are rotatable about their axles 22 and contact on the circuit board to be treated 5 or the path 5′, so that they are jointly rotated and a damaging frictional action between the surface of the pressing rolls 20 and the surface of the object 5 is avoided, which can damage especially sensitive materials(e.g. electronic circuit boards).

It will be understood that each of the elements described above, or two or more together, may also find a useful application in other types of structures differing from the types described above.

While the invention has been illustrated and described in an apparatus for treating and/or cleaning of an object, especially a circuit board, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims:

1. In an apparatus for one of treating, cleaning and treating and cleaning an object having a width B, especially a circuit board, with a flood flow of a fluid, said apparatus comprising means for moving said object along a path through said apparatus in a workpiece feed direction and at least one flood flow device having a length L and two opposing longitudinal sides positioned along said path, the improvement wherein each of said flood flow devices is located above said path to reduce apparatus expense and minimize assembly cost, and further comprising a fluid damming means contacting said path on each of said opposing longitudinal sides of each of said flood flow devices to define a fluid pool region above said path so that in operation a fluid pool arises in said fluid pool region between each of said flood flow devices and said fluid damming means for said flood flow device, and wherein said flood flow device comprises a plurality of fluid feed pipes, a fluid receiving chamber of a larger diameter than that of said fluid feed pipes, said fluid receiving chamber being connected to the feed pipes so as to be able to receive fluid therefrom, a perforated mask located downstream from the feed pipes in the receiving chamber, said perforated mask being provided with a plurality of through-going holes, and a distributor chamber provided with a single outlet mouth located downstream of the perforated mask, said distributor chamber with said outlet mouth and said path defining a flooded space for fluid adjacent said path, and the fluid receiving chamber, the distributor chamber, the outlet mouth and the flooded space extending over the entire length L of the flood flow device, said plurality of feed pipes connected with the fluid receiving chamber also being distributed over the entire length L and the holes of said perforated mask being distributed over the entire length L of the flood flow device, wherein the length L of the flood flow device is approximately at least equal to the width B of the object.

2. The improvement according to claim 1, wherein each of said fluid damming means comprises a pressing roll.

3. The improvement according to claim 1, wherein said through-going holes of said perforated mask are positioned displaced relative to said feed pipe and said outlet mouth in said workpiece feed direction.

4. The improvement according to claim 1, wherein said flood flow device is associated with a fluid pressure drop for said fluid, said feed pipes have a total feed pipe cross sectional area and said outlet mouth has an outlet cross sectional area dimensioned such that said pressure drop occurs substantially across said outlet mouth so that said perforated mask with said through-going holes and said distributor chamber can be removed from said flood flow device.

5. A method of one treating, cleaning and treating and cleaning an object, especially a circuit board, with a flood flow of a fluid in an apparatus according to claim 1, said method comprising the steps of positing said flood flow devices only above said path, feeding said object along said path and producing said flood flow from each of said flood flow devices, when said object arrives on said path in the vicinity of said flood flow devices so that said flood flow of said fluid occurs downwardly on said object on said path.

* * * * *